US009970406B2

(12) United States Patent
Kinoshita et al.

(10) Patent No.: US 9,970,406 B2
(45) Date of Patent: May 15, 2018

(54) IGNITION APPARATUS FOR INTERNAL COMBUSTION ENGINE

(71) Applicant: DENSO CORPORATION, Kariya, Aichi-pref. (JP)

(72) Inventors: Shota Kinoshita, Nishio (JP); Shinichi Okabe, Nishio (JP); Akimitsu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 107 days.

(21) Appl. No.: 15/059,742

(22) Filed: Mar. 3, 2016

(65) Prior Publication Data

US 2016/0258411 A1 Sep. 8, 2016

(30) Foreign Application Priority Data

Mar. 6, 2015 (JP) .................................. 2015-045231

(51) Int. Cl.
*F02P 9/00* (2006.01)
*F02P 11/00* (2006.01)
(Continued)

(52) U.S. Cl.
CPC ............... *F02P 9/007* (2013.01); *F02P 11/00* (2013.01); *F02P 23/04* (2013.01); *G01R 29/00* (2013.01);
(Continued)

(58) Field of Classification Search
CPC . F02P 9/007; F02P 11/00; F02P 23/04; G01R 29/00; H05H 1/24; H05H 1/46; H05H 1/52; H01T 13/50
(Continued)

(56) References Cited

U.S. PATENT DOCUMENTS 6,202,474 B1 * 3/2001 Takahashi ............. G01L 23/221
324/378
2004/0129241 A1 7/2004 Freen
(Continued)

FOREIGN PATENT DOCUMENTS

JP 2003322481 A * 4/2002
JP 2009-008100 1/2009
(Continued)

*Primary Examiner* — Lindsay Low
*Assistant Examiner* — Yi-Kai Wang
(74) *Attorney, Agent, or Firm* — Nixon & Vanderhye P.C.

(57) ABSTRACT

An ignition apparatus for an internal combustion engine is provided which includes a state-of-discharge determiner working to determine whether a center and a ground electrode of a spark plug are electrically conducting with each other or insulated from each other. When the center and ground electrodes are determined to be conducted with each other, the ignition apparatus alters controlled conditions of a high-frequency power supply which supplies a high-frequency power to the spark plug so as to decrease an average of a primary voltage outputted from the high-frequency power supply to the spark plug, thereby reducing an actual current flowing between the center and ground electrodes of the spark plug. This eliminates the risk of mechanical wear of the center and ground electrodes which usually arises from the flow of high current between the center and ground electrodes, thus resulting in an increase in service life of the spark plug.

8 Claims, 10 Drawing Sheets

(51) Int. Cl.
  *F02P 23/04* (2006.01)
  *G01R 29/00* (2006.01)
  *H05H 1/24* (2006.01)
  *H05H 1/46* (2006.01)
  *H05H 1/52* (2006.01)
  *H01T 13/50* (2006.01)

(52) U.S. Cl.
  CPC ............... *H05H 1/24* (2013.01); *H05H 1/46* (2013.01); *H05H 1/52* (2013.01); *H01T 13/50* (2013.01)

(58) Field of Classification Search
  USPC .......................................................... 123/608
  See application file for complete search history.

(56) References Cited

U.S. PATENT DOCUMENTS

| | | | |
|---|---|---|---|
| 2006/0027211 A1* | 2/2006 | Naruse | F02P 3/05 123/406.14 |
| 2009/0147543 A1 | 6/2009 | Sugawara et al. | |
| 2010/0206277 A1* | 8/2010 | Kajita | F02P 3/0846 123/620 |
| 2012/0223596 A1 | 9/2012 | Miura | |
| 2014/0090628 A1 | 4/2014 | Aida | |
| 2014/0139028 A1* | 5/2014 | Enomoto | H02J 3/00 307/68 |
| 2014/0261346 A1 | 9/2014 | Tanaya | |
| 2014/0265911 A1* | 9/2014 | Kamata | H02M 1/08 315/277 |

FOREIGN PATENT DOCUMENTS

| | | |
|---|---|---|
| JP | 2009-142088 | 6/2009 |
| JP | 2011-114877 | 6/2011 |
| JP | 2013-040582 | 2/2013 |
| JP | 2014-043859 | 3/2014 |
| JP | 2014-070626 | 4/2014 |
| JP | 2014-101796 | 6/2014 |
| JP | 2014-181560 | 9/2014 |
| JP | 2014-211148 | 11/2014 |

* cited by examiner

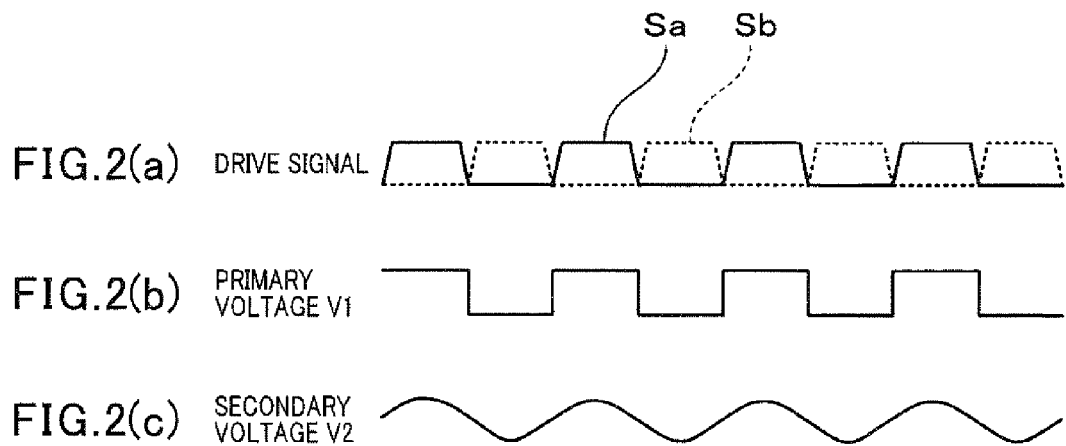
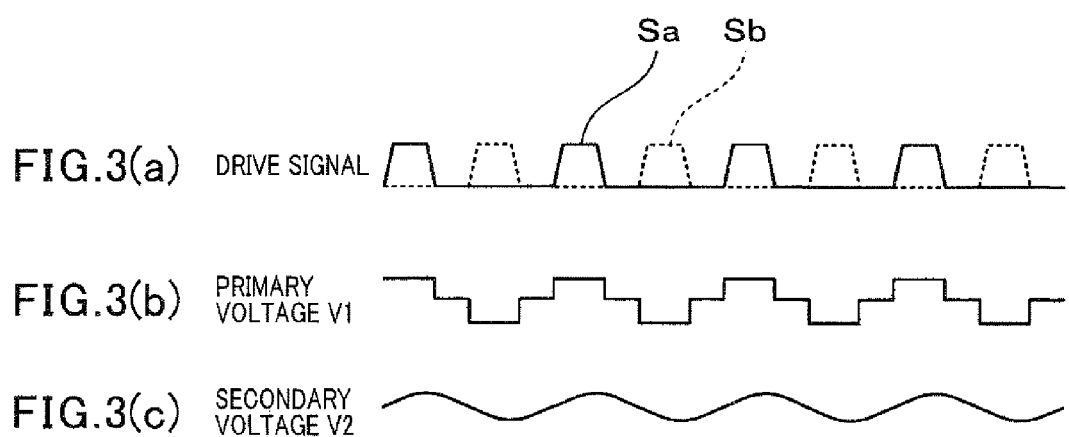

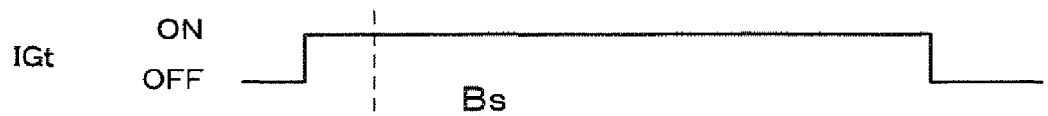
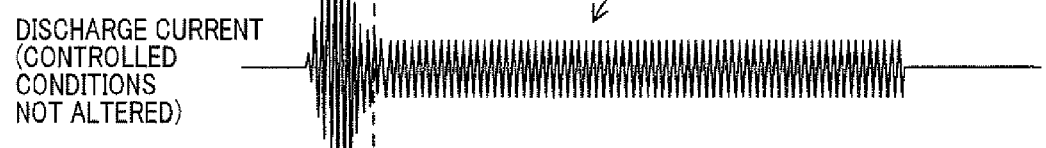
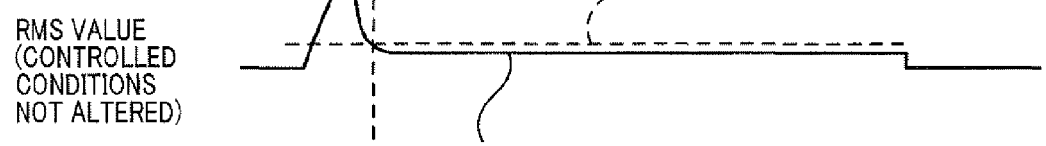
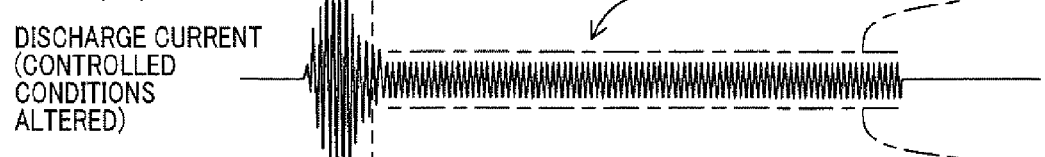
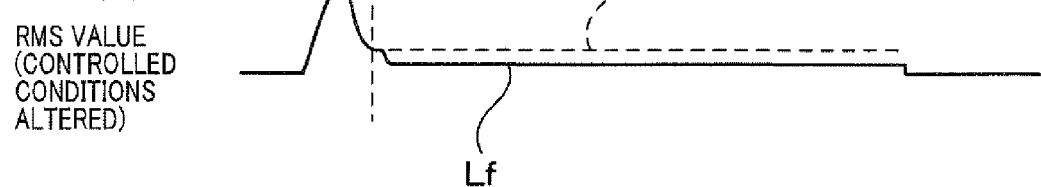

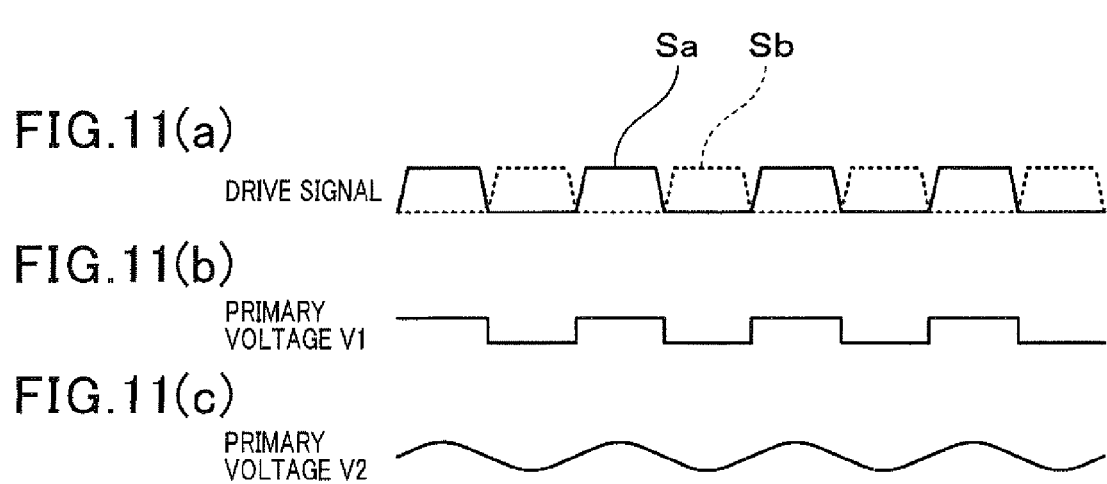

IGNITION APPARATUS FOR INTERNAL COMBUSTION ENGINE

CROSS REFERENCE TO RELATED DOCUMENT

The present application claims the benefit of priority of Japanese Patent Application No. 2015-45231 filed on Mar. 6, 2015, the disclosure of which is incorporated herein by reference.

BACKGROUND

1. Technical Field

This application relates generally to an ignition device for internal combustion engines.

2. Background Art

Typical internal combustion engines, such as gasoline engines mounted in automobiles, are equipped with an ignition device with a spark plug to ignite fuel sprayed into a combustion chamber of the engine. For instance, a spark plug is known for use in such an ignition device which has a center electrode and a ground electrode and works to develop a plasma discharge between the center electrode and the ground electrode in response to application of a high-frequency voltage to the center electrode.

For example, Japanese Patent First Publication No. 2014-211148 teaches an ignition device equipped with an ignition circuit working to supply a high-frequency voltage to the spark plug. Specifically, the ignition circuit applies the high-frequency voltage between the center electrode and the ground electrode of the spark plug to create and develop a streamer discharge moving on a surface of an insulator porcelain between the center electrode and the ground electrode, so that an AC glow discharge or an arc discharge (each of which will also be referred to below as a glow discharge) is produced along a discharge path, as made by the streamer discharge, between the center electrode and the ground electrode.

The action of the streamer discharge as a precursor to the generation of the glow discharge requires application of very high voltage to the spark plug. Specifically, a voltage (i.e., a peak-to-peak voltage) of as high as 30 kVpp is required to develop the streamer discharge to produce the glow discharge. For this purpose, the ignition circuit is equipped with a step-up transformer which works to step-up a primary voltage, as developed by a high-frequency power supply, up to a secondary voltage and apply it to the spark plug. The ignition circuit is equipped with the high-frequency power supply which delivers a degree of the primary voltage (i.e., a high-frequency power) needed to develop the required voltage to the step-up transformer, Once the glow discharge has been developed through the streamer discharge, the discharge will create an electrical conduction between the center electrode and the ground electrode of the spark plug, which results in a drop in impedance between the center electrode and the ground electrode, so that an electrical current actually flows therebetween. Accordingly, if the primary voltage (i.e., the high-frequency power) continues to be supplied, like when the streamer discharge is developed, to the step-up transformer to apply the secondary voltage to the spark plug, a high degree of current will flow between the center electrode and the ground electrode. In other words, an excessive current which is higher in level than that required to maintain the glow discharge will flow between the center electrode and the ground electrode, which results in a drop in durability of the spark plug arising from, for example, physical wear of the center and ground electrodes or deterioration of a resistor of the spark plug, The above publication teaches dividing the current into a plurality of stages and delivering them in sequence to the spark plug in order to ensure the durability of the spark plug (i.e., the burst control). It is, however, difficult for such a method to maintain the glow discharge at a required level.

SUMMARY

It is therefore an object of this disclosure to provide an ignition apparatus for internal combustion engines which is designed to enhance the durability of a spark plug mounted in the internal combustion engine.

According to one aspect of an embodiment, there is provided an ignition apparatus for an internal combustion engine which comprises: (a) a spark plug which includes a center electrode and a ground electrode to which a high frequency voltage is applied to create a plasma discharge between the center electrode and the ground electrode; (b) an ignition circuit which supplies the high frequency voltage to the spark plug; and (c) a state-of-discharge determiner which determines whether the center electrode and the ground electrode of the spark plug are in an insulated state where the center and ground electrodes are electrically insulated from each other or in a conducting state where the center and ground electrodes are electrically conducting through the discharge.

The ignition circuit includes a high-frequency power supply, a step-up circuit, and a power supply controller. The high-frequency power supply works to produce the high frequency power. The step-up circuit works to step-up a primary voltage of the high frequency power, as outputted by the high-frequency power supply, to produce and apply a secondary voltage to the spark plug. The power supply controller works to control an operation of the high-frequency power supply.

The power supply controller alters controlled conditions of the high-frequency power supply between when the state-of-discharge determiner determines that the center electrode and the ground electrode are in the insulated state and when the state-of-discharge determiner determines that the center electrode and the ground electrode are in the conducting state.

When the center electrode and the ground electrode are determined to be in the conducting state, the power supply controller changes the controlled conditions of the high-frequency power supply so as to decrease an average of the primary voltage outputted from the high-frequency power supply to the step-up circuit to be smaller than that when the center electrode and the ground electrode are determined to be in the insulated state.

The ignition apparatus is, as described above, equipped with the state-of-discharge determiner. When the state-of-discharge determiner decides that the center and ground electrodes are in the conducting state, the controlled conditions of the high-frequency power supply are altered so as to decrease the average of the primary voltage outputted from the high-frequency power supply, thereby reducing an actual current flowing in a discharge region between the center and ground electrodes of the spark plug. This reduces the risk of mechanical wear of the center and ground electrodes which usually arises from the flow of high current between the center and ground electrodes, thus resulting in an increase in service life of the spark plug.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 2(a) is a view which illustrates drive signals when controlled conditions of a high-frequency power supply are not altered in the ignition apparatus of FIG. 1;

FIG. 2(b) is a view which represents a primary voltage developed in the ignition apparatus of FIG. 1 when controlled conditions of a high-frequency power supply are not altered;

FIG. 2(e) is a view which represents a secondary voltage developed in the ignition apparatus of FIG. 1 when controlled conditions of a high-frequency power supply are not altered;

FIG. 3(a) is a view which illustrates drive signals when controlled conditions of a high-frequency power supply are altered in the ignition apparatus of FIG. 1;

FIG. 3(b) is a view which represents a primary voltage developed in the ignition apparatus of FIG. 1 when controlled conditions of a high-frequency power supply are altered;

FIG. 3(c) is a view which represents a secondary voltage developed in the ignition apparatus of FIG. 1 when controlled conditions of a high-frequency power supply are altered;

FIG. 4(a) is a view which represents an ignition signal inputted to the ignition apparatus of FIG. 1;

FIG. 4(b) is a view which represents a discharge current when controlled conditions of a high-frequency power supply are not altered in the ignition apparatus of FIG. 1;

FIG. 4(c) is a view which represents a RMS value when controlled conditions of a high-frequency power supply are not altered;

FIG. 4(d) is a view which represents a discharged state in a spark plug;

FIG. 4(e) is a view which represents a discharge current when controlled conditions of a high-frequency power supply are altered in the ignition apparatus of FIG. 1;

FIG. 4(f) is a view which demonstrates a RMS value of a primary current when controlled conditions of a high-frequency power supply are altered in the ignition apparatus of FIG. 1;

FIG. 11(a) is a view which illustrates drive signals when controlled conditions of a high-frequency power supply are altered in the ignition apparatus of FIG. 10;

FIG. 11(b) is a view which represents a primary voltage developed in the ignition apparatus of FIG. 10 when controlled conditions of a high-frequency power supply are altered; and FIG. 11(c) is a view which represents a secondary voltage developed in the ignition apparatus of FIG. 10 when controlled conditions of a high-frequency power supply are altered.

DESCRIPTION OF THE PREFERRED EMBODIMENTS

First Embodiment

Figure 1:
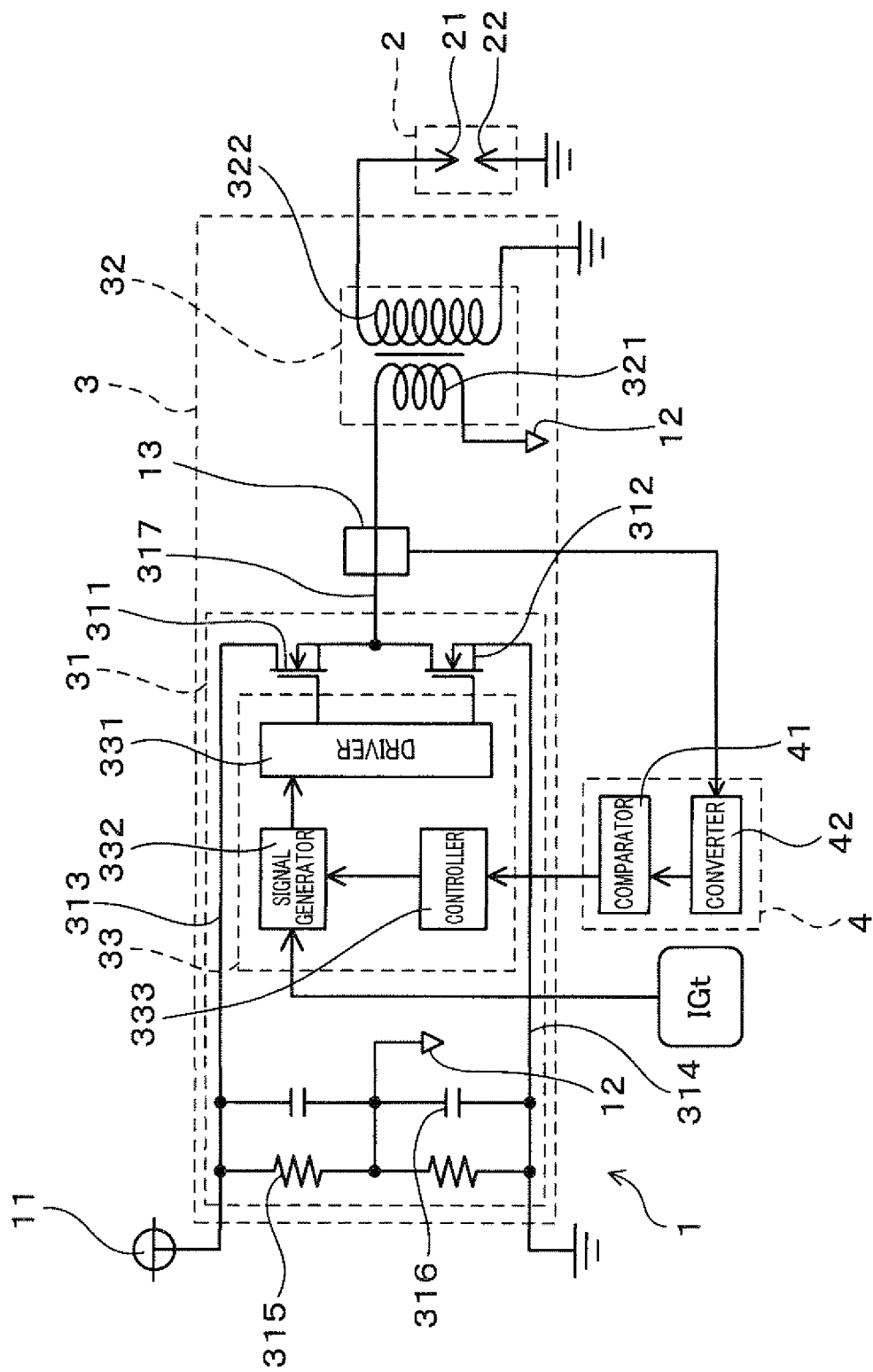
FIG. 1 is a circuit diagram which illustrates an internal structure of an ignition apparatus for an internal combustion engine according to the first embodiment.

Referring to the drawings, wherein like reference numbers refer to like parts in several views, particularly to FIGS. 1 to 6, there is shown an ignition apparatus 1 for internal combustion engines according to the first embodiment.

The ignition apparatus 1, as illustrated in FIG. 1, includes a spark plug 2, an ignition circuit 3, and a state-of-discharge determiner 4.

The spark plug 2 includes a center electrode 21 and a ground electrode 22 and works to produce a plasma discharge upon application of a high frequency voltage between the center electrode 21 and the ground electrode 22.

The ignition circuit 3 works to supply a high frequency power to the spark plug 2

The state-of-discharge determiner 4 serves as a state-of-discharge monitor to monitor whether the center electrode 21 and the ground electrode 22 to which the high frequency voltage is applied are electrically isolated from each other or not, in other words, whether electrical conduction between the center electrode 21 and the ground electrode 22 is created by the discharge, as developed therebetween or not.

The ignition circuit 3 includes a high-frequency power supply 31, a step-up circuit 32, and a power supply controller 33. The high-frequency power supply 31 produces and outputs a high frequency power. The step-up circuit 32 works as a step-up transformer to step-up a primary voltage, as developed by the output from the high-frequency power supply 31, to a secondary voltage and then applies it to the spark plug 2. The power supply controller 33 controls the operation of the high-frequency power supply 31.

The power supply controller 33 switches conditions for controlling the operation of the high-frequency power supply 31 between when the state-of-discharge determiner 4 concludes that the center electrode 21 and the ground electrode 22 are electrically insulated from each other and when it concludes that the center electrode 21 and the ground electrode 22 electrically conduct with each other.

Specifically, when it is determined that the center electrode 21 and the ground electrode 22 are electrically conducting with each other, the power supply controller 33 changes the control conditions so that an average value of the primary voltage delivered to the step-up circuit 32 is smaller than that when the control conditions are not changed, that is, when it is determined that the center electrode 21 and the ground electrode 22 are electrically insulated from each other.

Specifically, when the state-of-discharge determiner 4 determines that the center electrode 21 and the ground electrode 22 are electrically connected to each other, the power supply controller 44, as illustrated in FIGS. 2(*b*) and 3(*b*), selects duty factors or duty cycles of the primary voltage on the positive or negative side thereof to be smaller than those when the state-of-discharge determiner 4 determines that the center electrode 21 and the ground electrode 22 are electrically insulated from each other. This causes the average level of the primary voltage outputted from the high-frequency power supply 31 to the step-up circuit 32 when the center electrode 21 and the ground electrode 22 are electrically conducting with each other to be smaller than when the control conditions are not changed, that is, when the center electrode 21 and the ground electrode 22 are electrically insulated from each other. The average level or value of the primary voltage, as referred to therein, is a time-average of an absolute value of the primary voltage under the condition where a common potential 12, as will be described later in detail, is at a reference level (e.g., 0V). The duty cycle of the primary voltage on the positive side, as referred to herein, is a ratio between an active-duration for which a positive level of voltage is applied to the step-up circuit 32 and one cycle (i.e., the total period) of the high-frequency primary voltage outputted from the high-frequency power supply 31. The duty cycle of the primary voltage on the negative side, as referred, to herein, is a ratio between an active-duration for which a negative level of voltage is applied to the step-up circuit 32 and one cycle (i.e., the total period) of the high-frequency primary voltage outputted from the high-frequency power supply 31.

Figure 6:
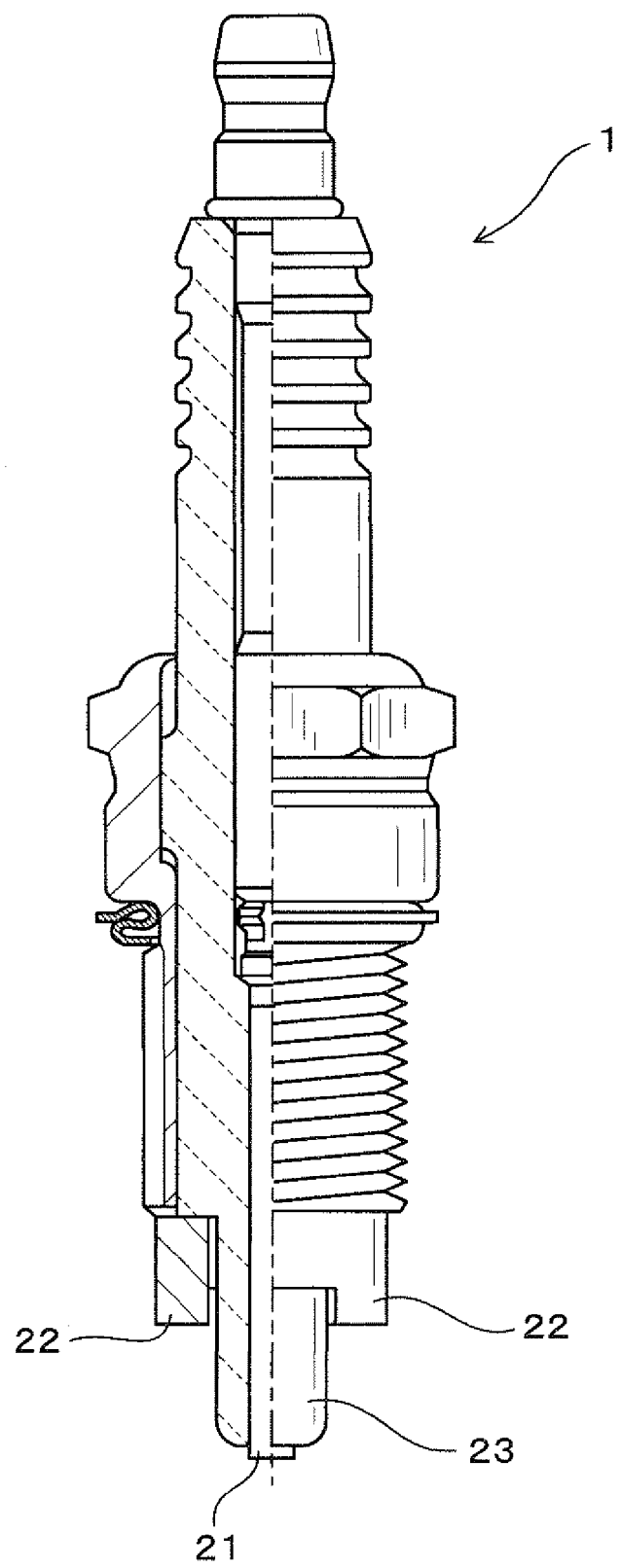
FIG. 6 is a partially longitudinal sectional view which shows a spark plug in the ignition apparatus of FIG. 1.

The spark plug 2 is, as illustrated in FIG. 6, equipped with the center electrode 21, an insulator porcelain 23 disposed around the outer periphery of the center electrode 21, and the ground electrode 22 arranged around the outer periphery of the insulator porcelain 23. The high-frequency high-voltage is applied to the center electrode 21 to create and then develop the streamer discharge moving along the surface of the insulator porcelain 23. The streamer discharge then creates a discharge path between the center electrode 21 and the ground electrode 22 on which an AC glow discharge or an arc discharge is developed.

The ignition apparatus 1 may be installed on internal combustion engines such as automotive engine.

The high-frequency power supply 31 is, as illustrated in FIG. 1, designed to convert the DC power, as delivered from the drive power supply 11, into the AC high-frequency power through switching operations of switching devices 311 and 312 and output it to the step-up circuit 32. The high-frequency power supply 31 has a high-potential line 313 to which the drive power supply 11 is connected, a low-potential line 314 connected to ground, two resistors 315 which are connected in series between the high-potential line 313 and the low-potential line 314, two capacitors 316 which are connected in series between the high-potential line 313 and the low-potential line 314, and the two switching devices 311 and 312 which are connected in series between the high-potential line 313 and the low-potential line 314.

The junctions between the resistors 315 and between the capacitors 316 are connected to the common potential 12.

Each of the switching devices 311 and 312 is implemented by, for example, a MOSFET (i.e., a metal-oxide semiconductor field-effect transistor) or an IGBT (i.e., an insulated gate bipolar transistor). An output terminal 317 of the high-frequency power supply 3 is disposed between the switching devices 311 and 312.

The high-frequency power supply 31 works to oscillate the high frequency power alternately to be equal in level on the positive and negative sides and output it from the output terminal 317, thereby ensuring the efficiency of the step-up operation of the step-up circuit 32.

The number of the resistors 315, the capacitors 316, or the switching devices 311 and 312 is not limited to two as long as they are disposed to be symmetrical between the high-potential line 313 and the low-potential line 314.

The step-up circuit 32 is made of a transformer equipped with a primary coil 321 and a secondary coil 322 which are magnetically coupled with each other. The step-up circuit 32 is designed to have a step-up factor of several tens to apply a peak-to-peak voltage of as high as 30 kVpp or more to the spark plug 2. The primary coil 321 of the step-up circuit 32 is connected at one end thereof to the output terminal 317 of the high-frequency power supply 31 and at the other end to the common potential 12. The secondary coil 322 is connected at one end thereof to the center electrode 21 of the spark plug 2 and at the other end to ground.

The power supply controller 33 is equipped with a switching driver 331 which works to control on-off operations of the switching devices 311 and 312. Specifically, the switching driver 331 works to input a drive signal to the gate of each of the switching devices 311 and 312. The power supply controller 33 includes a signal generator 332 which produces the drive signals and a pulse width controller 333 which controls a pulse width of the drive signals.

The pulse width controller 333 is responsive to an output of the state-of-discharge determiner 4 to control the pulse width of the drive signals, The state-of-discharge determiner 4 determines that the center electrode 21 and the ground electrode 22 of the spark plug 2 are electrically insulated from each other when an RMS (Root Mean Square) value, as indicated by the solid curve Lc in FIG. 4(*c*), of a primary current outputted from the high-frequency power supply 31 to the step-up circuit 32 is greater than a given reference value, as indicated by the broken line L0 in FIG. 4(*c*). Alternatively, when the RMS value is lower than the given reference value, the state-of-discharge determiner 4 determines that the center electrode 21 and the ground electrode 22 of the spark plug 2 are electrically connected together. The RMS value of the primary current, as referred to therein, is an instant effective value of the primary current, as calculated in one cycle thereof, Specifically, the ignition circuit 3 is, as illustrated in FIG. 1, equipped with a primary current sensor 13 which monitors a primary current outputted from the high-frequency power supply 31 to the step-up circuit 32. The state-of-discharge determiner 4 monitors an output from the primary current sensor 13 to determine the RMS value (i.e., the curve Lc in FIG. 4(*c*)) of the primary current. When the RMS value is greater than the given reference value (i.e., the broken line LO), the state-of-discharge determiner 4, as illustrated in FIGS. 4(*c*) and 4(*d*), decides that the center electrode 21 and the ground electrode 22 of the spark plug 2 are electrically insulated from each other. Alternatively, when the RMS value is lower than the given reference value, the state-of-discharge determiner 4 decides that the center electrode 21 and the ground electrode 22 of the spark plug 2 are electrically conducting to each other.

The state-of-discharge determiner 4 also includes an RMS/DC converter 42 and a comparator 41. The RMS/DC converter 42 works to convert the RMS value of the primary current, as measured by the primary current sensor 13, into a dc current value which is proportional to the RMS value.

The comparator 41 compares the dc current value with a reference current value and outputs a signal indicative of a discharged state to the power supply controller 33. The structure of the state-of-discharge determiner 4 is not limited to the above, but may be implemented by another known structure.

The primary current sensor 13 is preferably implemented by a magnetic field application sensor such as a Hall-IC, a current transformer, or a Rogowski coil in order to minimize a sensing power loss.

The operations and beneficial advantages of the ignition apparatus 1 of this embodiment will be described below.

Prior to describing the above, reference will be made to FIGS. 4(a) to 4(f). In FIGS. 4(a) to 4(f), a horizontal axial indicates an elapsed time. FIG. 4(a) represents an on- or off-state of an ignition signal IGt. FIG. 4(b) represents a change in instant value of discharge current flowing through the spark plug 2 when conditions of the high-frequency power supply 31 which are controlled by the power supply controller 33 are not altered. FIG. 4(c) represents a change in RMS value of the primary current when the controlled conditions of the high-frequency power supply 31 are not altered. In FIG. 4(c), the solid line Lc indicates the RMS value. The broken line L0 indicates the reference value.

FIG. 4(d) demonstrates results of decisions made by the state-of-discharge determiner 4. "S" indicates the fact that the center electrode 21 and the ground electrode 22 of the spark plug 2 are electrically insulated from (i.e., the streamer discharge is occurring). "G" indicates the fact that the center electrode 21 and the ground electrode 22 of the spark plug 2 are electrically conducting to each other (i.e., the glow discharge is occurring). FIG. 4(e) represents a change in instant value of current flowing through the spark plug 2 when the conditions of the high-frequency power supply 31 which are controlled by the power supply controller 33 are altered. FIG. 4(f) represents a change in RMS value of the primary current with time when the controlled conditions of the high-frequency power supply 31 are altered. In FIG. 4(f) the solid line Lf indicates the RMS value. The broken line LU indicates the reference value.

When the ignition signal IGt is, as illustrated in FIG. 4(a), inputted to the power supply controller 33 of the ignition circuit 3, the power supply controller 33 outputs the drive signals to the switching devices 311 and 312. The drive signals are, as illustrated in FIG. 2(a), high-frequency pulse signals which are inputted to the gates of the high-side switching device 311 and the low-side switching device 312 at selected times.

Specifically, the high-frequency pulse signals which are, as can be seen from FIG. 2(a), out of phase with each other by π radians are inputted to the switching devices 311 and 312, respectively. In FIG. 2(a), a rectangular wave Sa, as indicated by a solid line, represents the drive signal to be inputted to the high-side switching device 311. A rectangular wave Sb, as indicated by a broken line, represents the drive signal to be inputted to the low-side switching device 312.

When the drive signal is inputted to the switching device 311, a high-frequency primary voltage V1 is, as illustrated in FIG. 2(b), outputted from the output terminal 317 of the high-frequency power supply 31 to the primary coil 321 of the step-up circuit 32.

The primary voltage V1 of a high frequency power is stepped-up by the step-up circuit 32, so that a high-frequency secondary voltage V2 is, as illustrated in FIG. 2(c), developed at the secondary coil 322. The high-frequency secondary voltage V2 is then applied to the center electrode 21 of the spark plug 2, thereby creating the plasma discharge in a discharge gap of the spark plug 2. The plasma discharge is usually a streamer discharge at an initial stage and then transitions into a glow discharge.

The streamer discharge is usually created so as to extend from the ground electrode 22 to the center electrode 21 along the surface of the insulator porcelain 23. At this stage, the ground electrode 22 and the center electrode 21 are not yet connected fully through a discharge path. The discharge current, as developed in a discharging region between the center electrode 21 and the ground electrode 22, is thus a displacement current. The waveform of the displacement current usually has an increased amplitude, as indicated by Bs or Es in FIG. 4(b) or 4(e). When the center electrode 21 and the ground electrode 22 are connected fully through the discharge path, the glow discharge will be formed in the discharge region between the center electrode 21 and the ground electrode 22, so that an actual current flows between the center electrode 21 and the ground electrode 22.

As apparent from the above discussion, while the streamer discharge is being developed, the center electrode 21 and the ground electrode 22 are electrically insulated from each other. After the plasma discharge transitions into the glow discharge, the center electrode 21 and the ground electrode 22 will be conducting with each other, which results in a drop in impedance of the discharge region. This will result in a drop in quality factor (i.e., a Q-factor) of resonance in a circuit extending from the output terminal 317 of the high-frequency power supply 31 to the spark plug 2, so that the RMS value (Lc) of the primary current, as demonstrated in FIG. 4(c), decreases, The primary current sensor 13, thus, monitors the primary current flowing from the output terminal 317 of the high-frequency power supply 31 to the primary coil 321 of the step-up circuit 32. When the RMS value (Lc) of the primary current, as derived by the primary current sensor 13, has dropped below the reference value (L0), the state-of-discharge determiner 4, as illustrated in FIG. 4(d), determines that the center electrode 21 and the ground electrode 22 have become electrically conducted to each other, in other words, the discharge state in the discharge region has been changed from the streamer discharge into the glow discharge.

The state-of-discharge determiner 4 then outputs a signal indicating the fact that the center electrode 21 and the ground electrode 22 have been electrically conducting to each other to the power supply controller 33. The power supply controller 33 alters the controlled conditions of the high-frequency power supply 31. The controlled conditions, as referred to in this embodiment, are controlled variables, i.e., the duty cycles of the primary voltage on the positive and negative sides which are outputted from the high-frequency power supply 31 and expressed by the pulse widths of the drive signals to turn on or off the switching devices 311 and 312.

Specifically, when the center electrode 21 and the ground electrode 22 are determined as being electrically insulated from each other, each of the drive signals outputted to the switching devices 311 and 312 is set to have a greater pulse width, e.g., the duty cycle of each of the drive signals is selected to be about 50%. Alternatively, when the center electrode 21 and the ground electrode 22 are determined as being electrically conducting to each other, each of the drive signals outputted to the switching devices 311 and 312 is, as illustrated in FIG. 3(a), set to have a smaller pulse width, e.g., the duty cycle of each of the drive signals is selected to be about 30%. This causes the duty cycles of the primary voltage V1 on the positive and negative sides to drop when the center electrode 21 and the ground electrode 22 have changed from the insulated state to the conducting state, so that the average of the primary voltage V1 will decrease. The duty cycles on the positive and negative sides are usually identical in percentage with each other.

When the duty cycle on either of the positive or negative side is decreased from 50% to 30%, the average of the primary voltage outputted from the high-frequency power supply 31 to the step-up circuit 32 will decrease to about 60%. Actually, the impedance of the circuit extending from the output terminal 317 of the high-frequency power supply 31 to the spark plug 2 is, however, different between when the center electrode 21 and the ground electrode 22 are in the insulated state and when they are in the conducting state, thus resulting in a drop in amplitude of the primary voltage, so that the average of the primary voltage will actually drop below 60%.

In either case, when the controlled conditions of the high-frequency power supply 31 are altered when the center electrode 21 and the ground electrode 22 are in the conducting state, it will result in a decrease in average of the primary voltage as compared with when the controlled conditions of the high-frequency power supply 31 are not changed between when the center electrode 21 and the ground electrode 22 are in the insulated stare and when they are in the conducting state. This will result in a drop in secondary voltage V2, as can be seen in FIGS. 2(c) and 3(c), when the center electrode 21 and the ground electrode 22 are in the conducting state as compared with when the controlled conditions are not altered, so that a secondary current, as indicated, by Bg in FIG. 4(b) and Eg in FIG. 4(e), decreases. In FIG. 4(e), chain lines St and Bb represent instant maximum instantaneous values of the secondary current Bg in FIG. 4(b) when the controlled conditions are not altered.

With the above control, the glow discharge works to reduce the value of actual current flowing in the discharge region in the spark plug 2.

When the controlled conditions are altered in the above way, it will also cause the RMS value of the primary current, as illustrated in FIG. 4(f), to be different from that, as illustrated in FIG. 4(c), when the controlled conditions are not altered.

Figure 5:
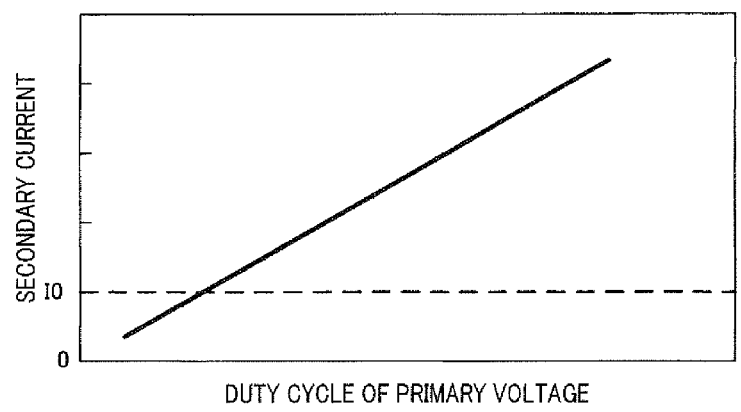
FIG. 5 is a graph which demonstrates a relation between a duty cycle of a primary voltage and a secondary voltage in the ignition apparatus of FIG. 1

The duty cycle of the primary voltage on each of the positive and negative sides and the magnitude of the secondary current bear, as demonstrated in FIG. 5, a proportional relation to each other. The decrease in magnitude of the secondary current is, thus, achieved by decreasing the duty cycle of the primary voltage. It is, however, necessary for the secondary current not to decrease below a value IO which is needed to sustain the glow discharge. A diminution rate r1 (i.e., a rate of decrease) of the duty cycle (i.e., the pulse width) of the primary voltage, therefore, needs to be selected in view of a ratio r2 between the magnitude of the secondary current flowing when the controlled conditions are not altered and the minimum value IO of the secondary current required to maintain the glow discharge. It is desirable to select the diminution rate r1 of the duty cycle to be as great as possible as long as it is greater than or equal to the ratio r2.

The ignition apparatus 1 is, as apparent from the above discussion, capable of reducing the value of actual current flowing in the discharge region between the center electrode 21 and the ground electrode 22 when they are electrically conducting to each other, thereby eliminating the risk of mechanical wear of the center electrode 21 and the ground electrode 22 which usually arises from the flow of high current between the center electrode 21 and the ground electrode 22. This results in an increase in service life of the spark plug 2.

The power supply controller 33 is designed in this embodiment to select the duty cycles of the primary voltage on both the positive and negative sides thereof when the center electrode 21 and the ground electrode 22 are placed in the conducting state to be smaller than those when they are placed in the insulated state. This facilitates the ease with which the average of the primary voltage is decreased to reduce the value of current actually flowing in the discharge region of the spark plug 2 for enhancing the durability of the spark plug 2.

The state-of-discharge determiner 4 is, as described above, designed to determine whether the center electrode 21 and the ground electrode 22 are in the insulated state or in the conducting state as a function of the RMS value of the primary current. The use of the RMS value ensures the accuracy of such a determination and enhances the improvement of the durability of the spark plug 2.

The ignition apparatus 1 of this embodiment, as apparent from the above discussion, capable of improving the service life of the spark plug 2 which may be employed in internal combustion engines.

Second Embodiment

Figure 7:
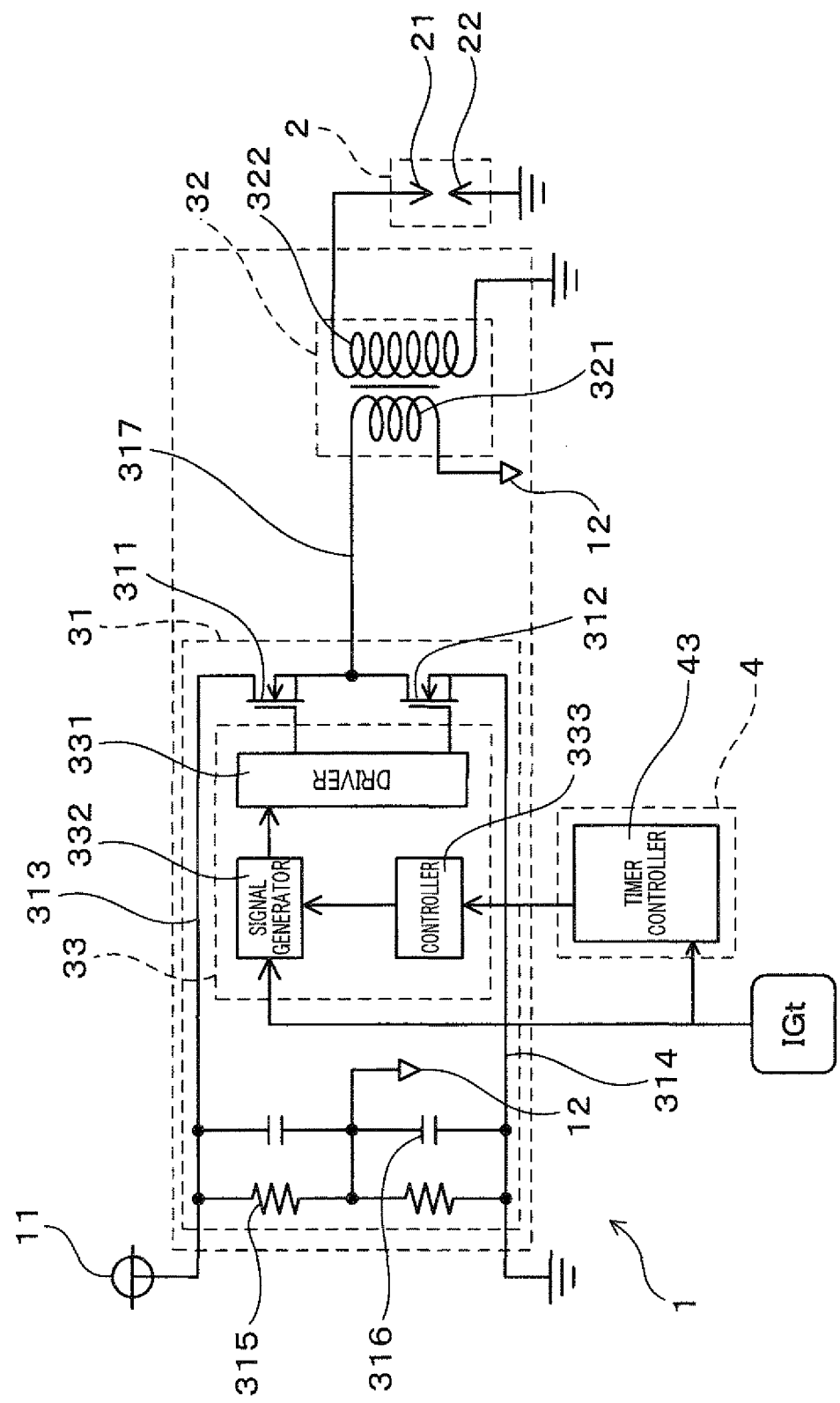
FIG. 7 is a circuit diagram which illustrates an internal structure of an ignition apparatus for an internal combustion engine according to the second embodiment.

The ignition apparatus 1 of this embodiment, as illustrated in FIG. 7, has the state-of-discharge determiner 4 equipped with a timer controller 43 which works to determine whether the center electrode 21 and the ground electrode 22 are in the insulated state or in the conducting state based on an elapsed time.

Specifically, the state-of-discharge determiner 4 decides that the center electrode 21 and the ground electrode 22 are in the insulated state before a lapse of a given period of time from when the ignition circuit 3 starts delivering the power to the spark plug 2 and that they are in the conducting state after the lapse of the given period of time.

More specifically, the state-of-discharge determiner 4 concludes that the center electrode 21 and the ground electrode 22 are in the insulated state between start time t0 when the ignition signal iGt is turned on and time t1 when a given period of time T has passed since the start time t0. After time t1, the state-of-discharge determiner 4 concludes that the center electrode 21 and the ground electrode 22 are in the conducting state. The time when the center electrode 21 and the ground electrode change from the insulated state (i.e., the streamer discharge) to the conducting state (i.e., the glow discharge) may be determined as a function of a parameter such as a speed of or a load on the internal combustion engine. The given period of time T may, therefore, be selected based on such a parameter. Accordingly, a map representing a relation of the given period of time T to the above parameter may be prepared and used by the state-of-discharge determiner 4 in selecting the value of the given period of time T. Other arrangements and operations are identical with those in the first embodiment. In the above and following discussions, the same reference numbers as employed in the first embodiment will refer to the same parts, and explanation thereof in detail will be omitted.

The use of the time elapsed since the start of delivery of power from the ignition circuit 3 to the spark plug 2 in determining whether the center electrode 21 and the ground electrode 22 are in the insulated state or in the conducting state eliminates the need for the current sensor 13 and results in simplified structure of the ignition apparatus 1.

Figure 8:
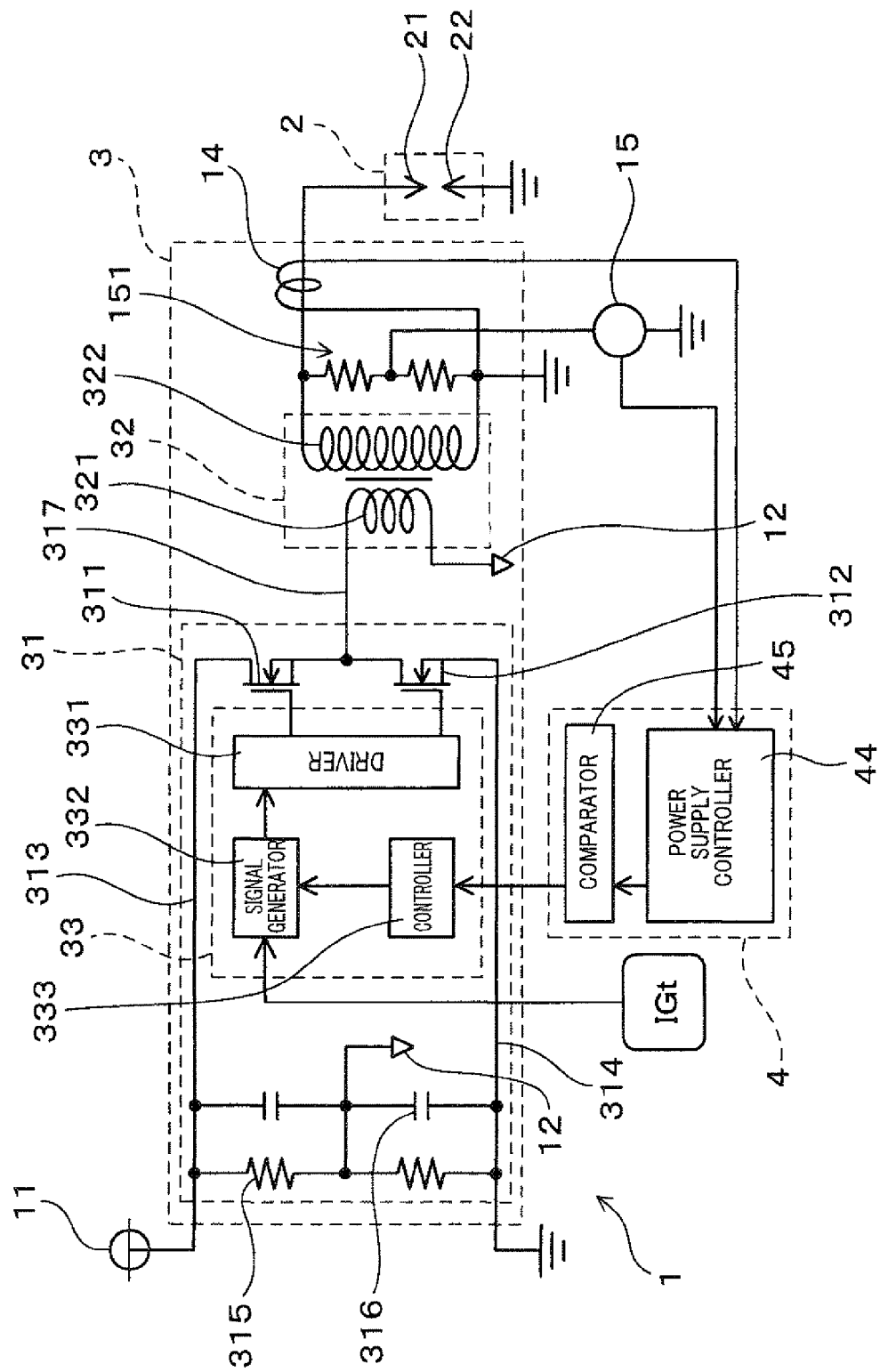
FIG. 8 is a circuit diagram which illustrates an internal structure of an ignition apparatus for an internal combustion engine according to the third embodiment.

The ignition apparatus 1 of the second embodiment also offers other beneficial advantages identical with those in the first embodiment, Third Embodiment The ignition apparatus 1 of this embodiment, as illustrated in FIG. 8, has the state-of-discharge determiner 4 designed to monitor a phase difference between the output current and the output voltage of the high frequency power, as outputted from the ignition circuit 3 to the spark plug 2, to determine whether the center electrode 21 and the ground electrode 22 are in the insulated state or in the conducting state.

Specifically, the ignition apparatus 1 is equipped with a secondary current sensor 14 and a secondary voltage sensor 15 disposed in an output line extending from the ignition circuit 3 to the spark plug 2. The secondary voltage is usually a very high voltage. A voltage-divider circuit 151 is disposed in connection with the secondary coil 322 of the step-up circuit 32. The voltage-dividing circuit 151 is made up of two resistors which are electrically connected in parallel to the secondary coil 322. The secondary voltage sensor 15 is connected to a junction of the resistors of the voltage-dividing circuit 151 to measure the voltage appearing at the junction as a function of the secondary voltage developed at the secondary coil 322.

When the above phase difference exceeds a given reference value, the state-of-discharge determiner 4 determines that the center electrode 21 and the ground electrode 22 are in the insulated state. Alternatively, when the phase difference is less than or equal to the reference value, the state-of-discharge determiner 4 determines that the center electrode 21 and the ground electrode 22 are in the conducting state.

Specifically, the state-of-discharge determiner 4 includes a phase difference calculator 44 and a comparator 45. The phase difference calculator 44 calculates the phase difference between the output current and the output voltage produced in the ignition circuit 3. The comparator 45 compares the phase difference, as derived by the phase difference calculator 44, with a reference value to determine whether the phase difference is greater than the reference value or riot. The state-of-discharge determiner 4 analyzes a result of the comparison, as made by the comparator 45, to determine whether the center electrode 21 and the ground electrode 22 are in the insulated state or in the conducting state and outputs a signal indicative thereof to the power supply controller 33. The phase difference calculator 44 is made of, for example, a combination of an integrator and a low-pass filter.

When the discharge region between the center electrode 21 and the ground electrode 22 to which the high frequency voltage is applied is in the insulated state, it will cause the displacement current to flow in the discharge region, so that the phase difference between the output current and the output voltage of the high frequency power delivered from the ignition circuit 3 to the spark plug 2 will be approximately $\pi/2$. Alternatively, when the discharge region between the center electrode 21 and the ground electrode 22 is in the conducting state, so that the discharge (i.e., the glow discharge) appearing in the discharge region creates an actual current, the phase difference will usually be about zero. The state-of-discharge determiner 4 monitors such a change in the phase difference to determine whether the center electrode 21 and the ground electrode 22 are in the insulated state or in the conducting state.

The reference value of the phase difference, as used in the state-of-discharge determiner 4, is set to $\pi/4$ in this embodiment. Specifically, when the above phase difference exceeds $\pi/4$, the state-of-discharge determiner 4 determines that the center electrode 21 and the ground electrode 22 are in the insulated state. Alternatively, when the phase difference is less than or equal to $\pi/4$, the state-of-discharge determiner 4 determines that the center electrode 21 and the ground electrode 22 are in the conducting state.

Other arrangements are identical with those in the first embodiment.

The ignition apparatus 1 of this embodiment is, as described above, engineered to determine whether the center electrode 21 and the ground electrode 22 are in the insulated state or in the conducting state as a function of the phase difference between the output current and the output voltage of the high frequency power supplied from the ignition circuit 3 to the spark plug 2. This enhances the accuracy of the determination of the discharged state of the spark plug 2.

Particularly, the state-of-discharge determiner 4 makes a decision about whether the phase difference exceeds $\pi/4$ or not to analyze the discharged state of the spark plug 2. This facilitates the ease with which the discharged state of the spark plug 2 is discriminated between the insulated state and the conducting state.

The ignition apparatus 1 of the third embodiment also offers other beneficial advantages identical with those in the first embodiment.

Fourth Embodiment

Figure 9:
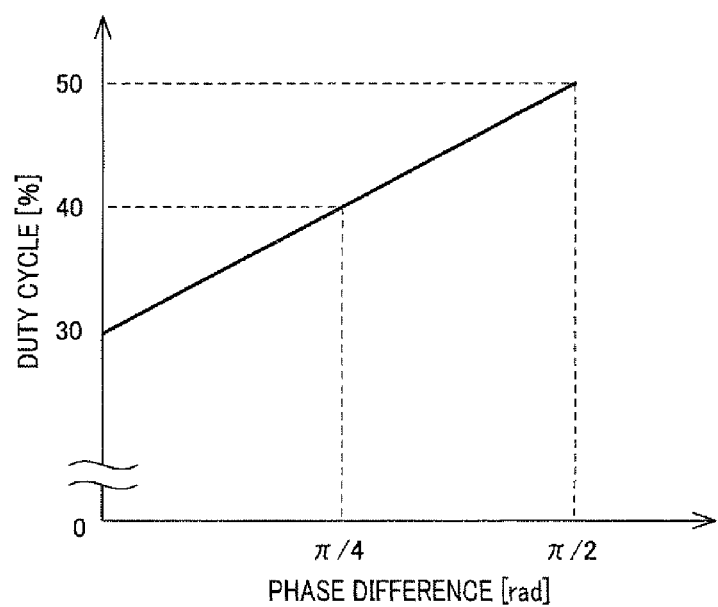
FIG. 9 is a graph which demonstrates a relation between a phase difference and a duty cycle of a primary voltage in an ignition apparatus according to the fourth embodiment.

The ignition apparatus 1 of this embodiment is, as illustrated in FIG. 9, designed to regulate the average of the primary voltage as a function of the phase difference between the output current and the output voltage of the high frequency power, as outputted from the ignition circuit 3 to the spark plug 2.

Specifically, the power supply controller 33 works to control the operation of the high-frequency power supply 31 so as to decrease the average of the primary voltage with a decrease in the phase difference.

The power supply controller 33 is, as illustrated in. FIG. 9, engineered to decrease the duty cycle of the primary voltage on each of the positive and negative sides as the phase difference decreases. For instance, when the phase difference is $\pi/2$, the power supply controller 33 sets the duty cycles of the primary voltage on the positive and negative sides to be 50%. When the phase difference is zero, the power supply controller 33 sets the duty cycles of the primary voltage on the positive and negative sides to be 30%. When the phase difference is $\pi/4$, the power supply controller 33 sets the duty cycles of the primary voltage on the positive and negative sides to be 40%. In this way, the power supply controller 33 gradually decreases the duty cycles of the primary voltage on the positive and negative sides with a decrease in the phase difference, so that the magnitude of the secondary current decreases with a decrease in the phase difference. Alternatively, when the phase difference increases, it will cause the secondary current to increase.

The phase difference may be determined in the same way as that in the third embodiment.

The ignition apparatus 1 of this embodiment, as apparent from the above discussion, works to change the duty cycles of the primary voltage on the positive and negative sides thereof (i.e., the average of the primary voltage) as a function of the phase difference between the output current and the output voltage of the high frequency power outputted to the spark plug 2 even when the insulated state or in the conducting state of the center electrode 21 and the ground electrode 22 remains unchanged.

Other arrangements are identical with those in the first embodiment.

The ignition apparatus 1 of this embodiment is capable of keeping the glow discharge. In other words, when the glow discharge is properly occurring in the spark plug 2, the actual current will flow in the discharge region of the spark plug 2, so that the phase difference is kept at approximately zero. However, when the phase difference changes, the actual current will decrease, thus resulting in an increase in risk of breakage or cutting of the discharge. In order to alleviate this problem, the ignition apparatus 1 of this embodiment increases the average (i.e., the duty cycle) of the primary voltage with an increase in the phase difference to increase the level of the secondary current (i.e., the actual current) for maintaining the glow discharge.

The ignition apparatus 1 of the fourth embodiment also offers other beneficial advantages identical with those in the first embodiment.

Fifth Embodiment

Figure 10:
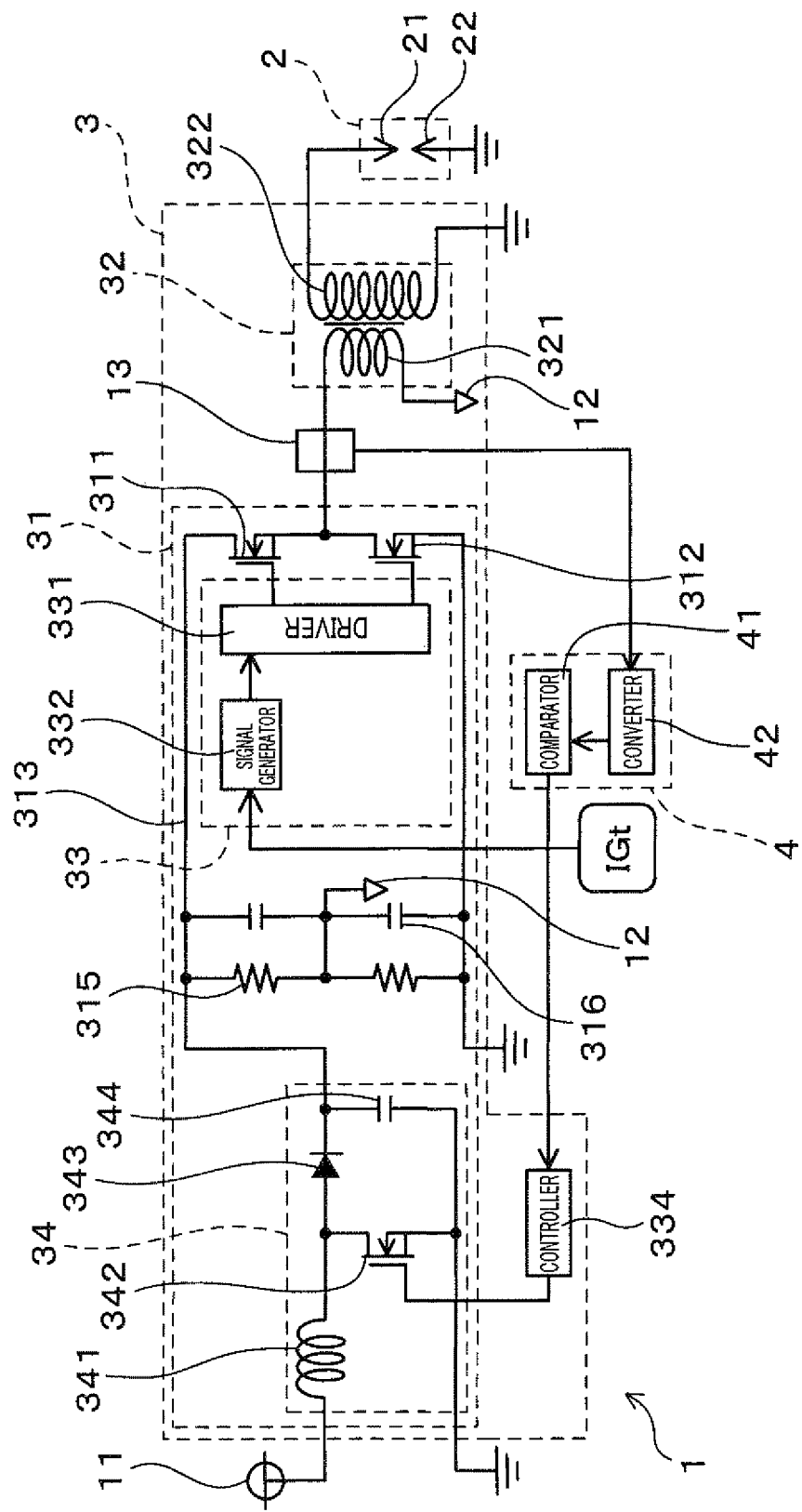
FIG. 10 is a circuit diagram which illustrates an internal structure of an ignition apparatus for an internal combustion engine according to the fifth embodiment.

The ignition apparatus 1 of this embodiment is, as illustrated in FIGS. 10 to 11(c), designed to change the magnitude (i.e., the peak value) of the primary voltage when the center electrode 21 and the ground electrode 22 are determined to be in the conducting state to be greater than that when the controlled conditions of the power supply controller 33 are not altered, that is, when the center electrode 21 and the ground electrode 22 are determined to be in the insulated state.

The ignition circuit 3 of the ignition apparatus 1 of this embodiment, as illustrated in FIG. 10, has the high-frequency power supply 31 equipped with a DC-DC converter 34. The DC-DC converter 34 steps up dc voltage, as developed by the drive power supply 11, and supplies it to between a high-potential line 313 and a low-potential line 314. The DC-DC converter 34 is designed to control or change a step-up ratio thereof to alter the level of the de voltage applied between the high-potential line 313 and the low-potential line 314.

The DC-DC converter 34 is made of a boost-up converter which includes, as can be seen in FIG. 10, a coil 341, a switching device 342, a diode 343, and a capacitor 344. The switching device 342 is made of a semiconductor device such as a MOSFET or an IGBT. The DC-DC converter 34 may alternatively be implemented by one of variety of known DC-DC converters such as an insulated flyback converter.

The power supply controller 33 is equipped with a pulse width controller 334 which works to control a pulse width of a drive signal outputted to the switching device 342. Specifically, the pulse width controller 334 changes the duty cycle (i.e., the pulse width) of the drive signal which drives the switching device 342, thereby controlling the amount of electrical energy stored in the coil 342 to regulate the output voltage, as produced by the DC-DC converter 34. This causes the de voltage applied between the high-potential line 313 and the low-potential line 314, that is, between the switching devices 311 and 312 to be changed.

The state-of-discharge determiner 4 (i.e., the pulse width controller 334) changes the pulse width (i.e., the duty cycle) of the drive signal outputted to the switching device 342 of the DC-DC converter 34 between when the center electrode 21 and the ground electrode 22 are determined to be in the insulated state and when they are determined to be in the conducting state. Specifically, the pulse width controller 334 sets the pulse width (i.e., the duty cycle) of the drive signal when the center electrode 21 and the ground electrode 22 are determined to be in the conducting state to be smaller than that when the center electrode 21 and the ground electrode 22 are determined to be in the insulated state. This causes the dc voltage, as outputted by the DC-DC converter 34 when the center electrode 21 and the ground electrode 22 are determined to be in the conducting state, to be greater in level than that when the center electrode 21 and the ground electrode 22 are determined to be in the insulated state.

The rise in the do voltage, as demonstrated in FIG. 11(b), causes the level (i.e., the peak value) of the primary voltage V1 outputted from the high-frequency power supply 31 when the center electrode 21 and the ground electrode 22 are determined to be in the conducting state to be smaller than that when the controlled conditions of the power supply controller 33 are not altered, that is, when the center electrode 21 and the ground electrode 22 are determined to be in the insulated state (see FIG. 2(b)). The ignition apparatus 1 of this embodiment, as can be seen in FIG. 11(a), does not change the switching operations for the switching devices 311 and 312 (i.e., the duty cycles of the drive signals outputted to the switching devices 311 and 312), but, as described above, decreases the peak value of the primary voltage V1 to decrease the averaged value of the primary voltage V1 when the center electrode 21 and the ground electrode 22 are determined to be in the conducting state, thereby reducing the secondary voltage V2, as illustrated in FIG. 11(c), to lower the secondary current as compared with when the controlled conditions of the power supply controller 33 are not altered, that is, when the center electrode 21 and the ground electrode 22 are determined to be in the insulated state.

Other arrangements are identical with those in the first embodiment.

The ignition apparatus 1 of this embodiment is, like in the above embodiment, capable of reducing the value of the actual current flowing in the discharge region, between the center electrode 21 and the ground electrode 22 when they are electrically conducting to each other, thereby eliminating the risk of mechanical wear of the center electrode 21 and the ground electrode 22 which usually arises from the flow of high current between the center electrode 21 and the ground electrode 22. This results in an increase in service life of the spark plug 2.

The ignition apparatus 1 of the fourth embodiment also offers other beneficial advantages identical with those in the first embodiment.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

For instance, the ignition apparatus 1 may be equipped with the state-of-discharge determiner 4 which is designed to perform the functions in both the first and second embodiments. The state-of-discharge determiners 4 in the first and second embodiments may produce results of the determination which are different from each other. It is, therefore, preferable to determine that the center electrode 21 and the ground electrode 22 are in the conducting state when a condition where both the state-of-discharge determiners 4 in the first and second embodiments make the same decision that the center electrode 21 and the ground electrode 22 are in the conducting state is met. In other words, when a condition where the state-of-discharge determiner 4 of either one of the first and second embodiments concludes that the center electrode 21 and the ground electrode 22 are in the insulated state is met, it is preferably determined that the center electrode 21 and the ground electrode 22 are in the insulated state.

The ignition apparatus 1 may be engineered to perform a combination of two or more of the functions, as described in the first to fifth embodiments and modify the combined functions when logic inconsistency occurs between them.

What is claimed is:

1. An ignition apparatus for an internal combustion engine comprising:
    a spark plug which includes a center electrode and a ground electrode to which a high frequency voltage is applied to create a plasma discharge between the center electrode and the ground electrode;
    an ignition circuit which supplies the high frequency voltage to the spark plug; and
    a state-of-discharge determiner which determines whether the center electrode and the ground electrode of the spark plug are in an insulated state where the center and ground electrodes are electrically insulated from each other or in a conducting state where the center and ground electrodes are electrically conducting through the discharge,
    wherein the ignition circuit includes a high-frequency power supply, a step-up circuit, and a power supply controller, the high-frequency power supply working to produce the high frequency power, the step-up circuit working to step-up a primary voltage of the high frequency power, as outputted by the high-frequency power supply, to produce and apply a secondary voltage to the spark plug, the power supply controller working to control an operation of the high-frequency power supply,
    wherein the power supply controller alters controlled conditions of the high-frequency power supply between when the state-of-discharge determiner determines that the center electrode and the ground electrode are in the insulated state and when the state-of-discharge determiner determines that the center electrode and the ground electrode are in the conducting state, and
    wherein when the center electrode and the ground electrode are determined to be in the conducting state, the power supply controller changes the controlled conditions of the high-frequency power supply so as to decrease an average of the primary voltage outputted from the high-frequency power supply to the step-up circuit to be smaller than that when the center electrode and the ground electrode are determined to be in the insulated state.

2. An ignition apparatus for an internal combustion engine as set forth in claim 1, wherein when the center electrode and the ground electrode are determined to be in the conducting state, the power supply controller decrease duty cycles of the primary voltage on a positive and a negative sides thereof to be smaller than those when the center electrode and the ground electrode are determined to be in the insulated state.

3. An ignition apparatus for an internal combustion engine as set forth in claim 1, wherein the state-of-discharge determiner is configured to monitor a primary current outputted from the high-frequency power supply and decide that the center and ground electrodes are in the insulated state when a Root Mean Square value of the primary current outputted from the high-frequency power supply to the step-up circuit is greater than a given reference value and alternatively decide that the center and ground electrodes are in the conducting state when the Root Mean Square value is smaller than the given reference value.

4. An ignition apparatus for an internal combustion engine as set forth in claim 1, wherein the state-of-discharge determiner decides that the center and ground electrodes are in the insulated state before a lapse of a given period of time from when the ignition circuit starts delivering the high frequency power to the spark plug and that the center and ground electrodes are in the conducting state after the lapse of the given period of time.

5. An ignition apparatus for an internal combustion engine as set forth in claim 1, wherein the state-of-discharge determiner is configured to monitor a phase difference between an output current and output voltage of the high frequency power delivered from the ignition circuit to the spark plug and decide whether the center and ground electrodes are in the insulated state or in the conducting state as a function of the phase difference between the output current and the output voltage of the high frequency power delivered from the ignition circuit to the spark plug.

6. An ignition apparatus for an internal combustion engine as set forth in claim 5, wherein the state-of-discharge determiner decides that the center and ground electrodes are in the insulated state when the phase difference exceeds a given reference value and that the center and ground electrodes are in the conducting state when the phase difference is less than or equal to the given reference value.

7. An ignition apparatus for an internal combustion engine as set forth in claim 6, wherein the given reference value is $\pi/34$.

8. An ignition apparatus for an internal combustion engine as set forth in claim 5, wherein the power supply controller control the operation of the high-frequency power supply so as to decrease the average of the primary voltage as the phase difference decreases.

* * * * *